(12) United States Patent
Zhao

(10) Patent No.: US 11,088,314 B2
(45) Date of Patent: Aug. 10, 2021

(54) ULTRASONIC TRANSDUCER AND METHOD FOR MANUFACTURING THE SAME, DISPLAY SUBSTRATE AND METHOD FOR MANUFACTURING THE SAME

(71) Applicant: BOE Technology Group Co., Ltd., Beijing (CN)

(72) Inventor: Lei Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 103 days.

(21) Appl. No.: 16/225,419

(22) Filed: Dec. 19, 2018

(65) Prior Publication Data

US 2019/0210867 A1    Jul. 11, 2019

(30) Foreign Application Priority Data

Jan. 5, 2018   (CN) .......................... 201810010853.1

(51) Int. Cl.
*H01L 41/08* (2006.01)
*H01L 41/297* (2013.01)
(Continued)

(52) U.S. Cl.
CPC ............ *H01L 41/0815* (2013.01); *B81B 7/04* (2013.01); *B81C 1/00182* (2013.01); *B81C 1/00531* (2013.01); *B81C 1/00539* (2013.01); *H01L 41/09* (2013.01); *H01L 41/0973* (2013.01); *H01L 41/1138* (2013.01); *H01L 41/23* (2013.01); *H01L 41/297* (2013.01); *H01L 41/332* (2013.01); *B81B 2201/0271* (2013.01)

(58) Field of Classification Search
CPC ................. H01L 41/23; B81C 1/00182; B81B 2203/0315
See application file for complete search history.

(56) References Cited

U.S. PATENT DOCUMENTS

2004/0113524 A1* 6/2004 Baumgartner ........ B06B 1/0292
310/328
2013/0270967 A1* 10/2013 Dausch ................ G10K 11/004
310/365
(Continued)

FOREIGN PATENT DOCUMENTS

CN    106660074 A    5/2017
CN    107084807 A    8/2017

OTHER PUBLICATIONS

First Office Action dated Dec. 25, 2020 for application No. CN201810010853.1 with English translation attached.

*Primary Examiner* — Jamie C Niesz
(74) *Attorney, Agent, or Firm* — Nath, Goldberg & Meyer; Joshua B. Goldberg

(57) ABSTRACT

The present disclosure provides an ultrasonic transducer and a method for manufacturing an ultrasonic transducer, a display substrate and a method for manufacturing a display substrate. The method for manufacturing the ultrasonic transducer includes: forming a via hole in a substrate; forming a structural layer on a side of the substrate, the structural layer cover the via hole; and etching the structural layer from a side of the substrate away from the structural layer by using the substrate formed with the via hole as a blocking layer, to form a cavity at a position of the structural layer corresponding to that of the via hole.

11 Claims, 2 Drawing Sheets

(51) Int. Cl.
  *H01L 41/09* (2006.01)
  *B81C 1/00* (2006.01)
  *H01L 41/332* (2013.01)
  *B81B 7/04* (2006.01)
  *H01L 41/113* (2006.01)
  *H01L 41/23* (2013.01)

(56) References Cited

U.S. PATENT DOCUMENTS

2017/0252777 A1\* 9/2017 Kidwell, Jr. ........ H01L 41/0472
2017/0323132 A1\* 11/2017 Lu ...................... G06K 9/00107

\* cited by examiner

ULTRASONIC TRANSDUCER AND METHOD FOR MANUFACTURING THE SAME, DISPLAY SUBSTRATE AND METHOD FOR MANUFACTURING THE SAME

CROSS-REFERENCE TO RELATED APPLICATIONS

The present application claims the priority of Chinese Patent Application No. 201810010853.1, filed on Jan. 5, 2018, the contents of which are incorporated herein in their entirety by reference.

TECHNICAL FIELD

The present disclosure relates to the field of ultrasonic transducer, and in particular, to an ultrasonic transducer and a method for manufacturing the ultrasonic transducer, a display substrate and a method for manufacturing the display substrate.

BACKGROUND

Micro-electromechanical systems ultrasonic transducer (referred to as MUT) is a novelty ultrasonic transducer manufactured by adopting microelectronic and micromachining technology. Compared with a traditional ultrasonic transducer, MUT has advantages such as small size, light weight, low cost, low power consumption, high reliability, flexible frequency control, wide frequency bandwidth, high sensitivity, easy to be integrated with circuit and realize intellectualization. Recently, MUT has gradually entered the application field from the research field.

MUT mainly includes piezoelectric MUT (referred to as PMUT) and capacitive MUT (referred to as CMUT). Compared with the traditional ultrasonic transducer, PMUT has advantages such as easy to be arrayed, high integration and powerful anti-jamming performance, and has obvious superiority in realizing high precision and process integration with IC.

Generally, a cavity of PMUT is formed by using a silicon wafer as a substrate and etching the silicon wafer from a back side of the silicon wafer.

SUMMARY

An embodiment of the present disclosure provides a method for manufacturing an ultrasonic transducer, including: forming a via hole in a substrate; forming a structural layer on a side of the substrate, the structural layer cover the via hole; etching the structural layer from a side of the substrate away from the structural layer by using the substrate formed with the via hole as a blocking layer, to form a cavity at a position of the structural layer corresponding to that of the via hole.

In some implementations, the via hole is formed in the substrate by using a laser beam to irradiate the substrate.

In some implementations, the structural layer is formed of organic material or inorganic insulation material.

In some implementations, the structural layer is etched from the side of the substrate away from the structural layer by using a dry etching process and using the substrate formed with the via hole as the blocking layer.

In some implementations, the dry etching process is performed by using plasma formed from oxygen.

In some implementations, the structural layer is etched from the side of the substrate away from the structural layer by using a wet etching process and using the substrate formed with the via hole as the blocking layer.

In some implementations, the method further includes: after forming the via hole in the substrate and before forming the structural layer on the side of the substrate, polishing and/or grinding both sides of the substrate formed with the via hole, so that a first side of the substrate on which the structural layer is to be formed and a second side of the substrate away from the first side are smooth.

In some implementations, the method further includes: after forming the structural layer on the side of the substrate, forming a first electrode on a side of the structural layer away from the substrate; forming a piezoelectric material layer on the side of the first electrode away from the structural layer; and forming a second electrode on a side of the piezoelectric material layer away from the first electrode.

In some implementations, the method further includes: before forming the first electrode on the side of the structural layer away from the substrate, forming a dielectric layer on the side of the structural layer away from the substrate.

In some implementations, the method further includes: before forming the second electrode on the side of the piezoelectric material layer away from the first electrode, forming an electrode isolating layer on the substrate formed with the piezoelectric material layer, the electrode isolating layer is formed at side surfaces of the first electrode perpendicular to the substrate to at least isolate the first electrode from outside.

In some implementations, the method further includes: after forming the second electrode on the side of the piezoelectric material layer away from the first electrode, forming a planarization layer on the side of the substrate formed with the second electrode.

An embodiment of the present disclosure further provides a method for manufacturing a display substrate, including: the method for manufacturing the ultrasonic transducer according to any of embodiments of the present disclosure; and after forming the second electrode on the side of the piezoelectric material layer away from the first electrode, forming a display element on the side of the substrate formed with the second electrode.

An embodiment of the present disclosure further provides an ultrasonic transducer, including: a substrate provided with a via hole therein; a structural layer provided on a side of the substrate and provided with a cavity therein, the cavity is provided at a position of the structural layer corresponding to that of the via hole.

In some implementations, the ultrasonic transducer further includes: a first electrode, a piezoelectric material layer and a second electrode provided successively on a side of the structural layer away from the substrate.

In some implementations, the ultrasonic transducer further includes: a dielectric layer provided between the structural layer and the first electrode.

In some implementations, the ultrasonic transducer further includes: an electrode isolating layer provided at side surfaces of the first electrode perpendicular to the substrate to at least isolate the first electrode from outside.

In some implementations, the electrode isolating layer is provided at side surfaces of the first electrode and the piezoelectric material layer perpendicular to the substrate to isolate the first electrode and the piezoelectric material layer from outside.

In some implementations, the ultrasonic transducer further includes a planarization layer provided on the side of the substrate provided with the second electrode.

An embodiment of the present disclosure provides a display substrate including: a plurality of ultrasonic transducers according to any of embodiments of the present disclosure; and a display element provided on a side of the second electrode of each of the ultrasonic transducers away from the piezoelectric material layer, the ultrasonic transducers are arranged in an array.

In some implementations, the display substrate further includes: a plurality of first driving lines parallel to and spaced apart from each other and a plurality of second driving lines parallel to and spaced apart from each other, the first driving lines and the second driving lines are intersected with each other, each of the ultrasonic transducers is provided at an intersection of one of the first driving lines and one of the second driving lines, and each of the first driving lines and each of the second driving lines are respectively coupled to the first electrodes and the second electrodes of corresponding ones of the ultrasonic transducers.

DESCRIPTION OF EMBODIMENTS

In order to make a person skilled in the art understand technical solutions of the present disclosure better, the ultrasonic transducer and the method for manufacturing the ultrasonic transducer, the display substrate and method for manufacturing the display substrate according to embodiments of the present disclosure will be described in detail below in conjunction with accompanying drawings.

Figure 1:
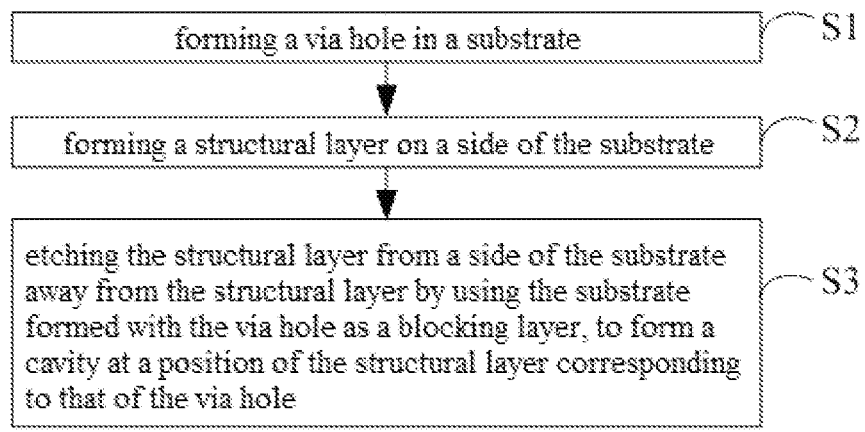
FIG. 1 shows a flowchart of a method for manufacturing an ultrasonic transducer in an embodiment of the present disclosure.
Figure 2:
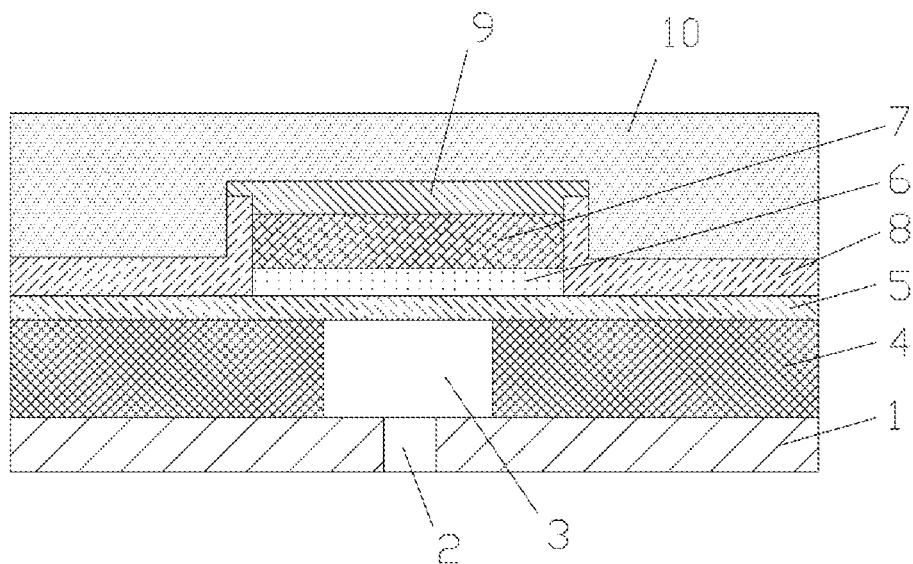
FIG. 2 shows a partial sectional viewing diagram of an ultrasonic transducer in an embodiment of the present disclosure.

As shown in FIGS. 1 and 2, an embodiment of the present disclosure provides a method for manufacturing an ultrasonic transducer, including steps of: S1, forming a via hole 2 in a substrate 1; S2, forming a structural layer 4 on a side of the substrate 1, the structural layer 4 covers the via hole 2; and S3, etching the structural layer 4 from a side of the substrate 1 away from the structural layer 4 by using the substrate 1 formed with the via hole 2 as a blocking layer, to form a cavity 3 at a position of the structural layer 4 corresponding to that of the via hole 2.

Herein, the cavity 3 being formed at the position of the structural layer 4 corresponding to that of the via hole 2 means that orthographic projections of the position of the cavity 3 and the position of the via hole 2 on the substrate 1 at least partially overlap with each other.

In some implementations, the structural layer 4 may be formed to cover an entire of the substrate 1.

In some implementations, the substrate 1 may be formed of glass, silicon, resin or the like.

In some implementations, in the step S1, the via hole 2 may be formed in the substrate 1 by using a laser beam to irradiate the substrate 1, and the process for forming the via hole 2 by using the laser beam to irradiate the substrate 1 has advantages such as easy to be arrayed, high efficiency and so on.

In the present embodiment, the via hole 2 may have a shape and a dimension set as required, for example, the dimension (length or width) of the via hole 2 in a plane of the substrate 1 may range from 10 μm to 500 μm.

In some implementations, the structural layer 4 may be formed of organic material or inorganic insulation material. The organic material may include resin, and the inorganic insulation material may include silicon nitride, silicon oxide, amorphous silicon (a-Si) with low carrier mobility or the like.

In the embodiment, the structural layer 4 may have a thickness (dimension in a direction perpendicular to the substrate 1) set as required, for example, the thickness of the structural layer 4 may range from 10 μm to 200 μm.

In some implementations, in the step S3, the structural layer 4 may be etched from the side of the substrate 1 away from the structural layer 4 by using a dry etching process and using the substrate 1 formed with the via hole 2 as the blocking layer. For example, the dry etching process may be performed by using plasma formed from oxygen, which results in advantages such as good etching uniformity, no solid etching by-products, process results being controllable or the like.

In some implementations, in the step S3, the structural layer 4 may be etched from the side of the substrate 1 away from the structural layer 4 by using a wet etching process and using the substrate 1 formed with the via hole 2 as the blocking layer. For example, the structural layer 4 being etched by using the wet etching process may refer to the structural layer 4 being corroded by an organic solvent.

In practical applications, the cavity 3 may have a shape and a dimension set as required. For example, the dimension (length or width) of the cavity 3 in a plane of the structural layer 4 may range from 10 μm to 500 μm. Moreover, the dimension of the cavity 3 in the plane of the structural layer 4 may be equal to or greater than that of the via hole 2 in the plane of the substrate 1. Furthermore, a time duration of a process for forming the cavity 3 may be adjusted to control a volume of the cavity 3 to be formed, thus controlling for the volume of the cavity 3 is achieved.

It should be noted that, in practical applications, the dry etching process or the wet etching process is selected in the step S3 according to materials of the substrate 1 and the structural layer 4, as long as the structural layer 4 is etched as required and the substrate 1 is not etched in the step S3.

In some implementations, the method further includes: after the step S1 and before the step S2, polishing and/or grinding both sides of the substrate 1 formed with the via hole 2, so that a first side of the substrate 1 on which the structural layer 4 is to be formed and a second side of the substrate 1 away from the first side are smooth.

When the via hole 2 is formed by using the laser beam to irradiate the substrate 1, after the via hole 2 is formed, condensation of molten matter occurs at the position of the via hole 2, thus the substrate 1 formed with the via hole 2 needs to be smoothed.

In some implementations, the step S2 may include: coating material of the structural layer 4 on the side of the substrate 1; and curing the material of the structural layer 4.

That is to say, the structural layer 4 may be formed by coating and curing material.

In some implementations, the method further includes: after the step S2, forming a first electrode 6 on a side of the structural layer 4 away from the substrate 1; forming a piezoelectric material layer 7 on a side of the first electrode 6 away from the structural layer 4; and forming a second electrode 9 on a side of the piezoelectric material layer 7 away from the first electrode 6.

It should be understood that, the step S3 may be performed after any of forming the first electrode 6, forming the piezoelectric material layer 7 and forming the second electrode 9, or before forming the first electrode 6.

In some implementations, as shown in FIG. 2, orthographic projections of the first electrode 6 and the piezoelectric material layer 7 on the substrate 1 may completely overlap with each other, that is, the dimension of the first electrode 6 in a plane parallel to the substrate 1 may be substantially consistent with that of the piezoelectric material layer 7 in the plane parallel to the substrate 1.

In some implementations, the first electrode 6 may be formed of molybdenum (Mo), aluminum (Al), titanium (Ti), neodymium (Nd), niobium (Nb), nickel (Ni), silver (Ag) or the like, a thickness of the first electrode 6 (dimension in the direction perpendicular to the substrate 1) may range from 100 nm to 1000 nm, and an area of the orthographic projection of the first electrode 6 on the substrate 1 may range from $10 \times 10$ $\mu m^2$ to $500 \times 500$ $\mu m^2$.

In some implementations, the piezoelectric material layer 7 may be formed of PZT (lead zirconate titanate), ZnO (zinc oxide), AlN (aluminium nitride), PMNPT (relaxor ferroelectric single crystal) or the like, a thickness (dimension in the direction perpendicular to the substrate 1) of the piezoelectric material layer 7 may range from 1 $\mu m$ to 5 $\mu m$, and an area of the orthographic projection of the piezoelectric material layer 7 on the substrate 1 may range from $10 \times 10$ $\mu m^2$ to $500 \times 500$ $\mu m^2$.

In some implementations, the second electrode 9 may be formed of Mo, Al, Ti, Nd, Nb, Ni, Ag or the like, a thickness of the second electrode 9 (dimension in the direction perpendicular to the substrate 1) may range from 100 nm to 1000 nm, and an area of the orthographic projection of the second electrode 9 on the first substrate 1 may range from $10 \times 10$ $\mu m^2$ to $500 \times 500$ $\mu m^2$.

That is to say, in some implementations, areas of orthographic projections of the first electrode 6, the piezoelectric material layer 7 and the second electrode 9 on the substrate 1 may be consistent and completely overlap with each other.

In some implementations, the method further includes: before forming the first electrode 6 on the side of the structural layer 4 away from the substrate 1, forming a dielectric layer 5 on the side of the structural layer 4 away from the substrate 1.

For example, the dielectric layer 5 may increase an adhesion force between the structural layer 4 and the first electrode 6. The dielectric layer 5 may be formed of $Si_xO_y$, $Si_xN_y$, $Si_xO_yN_z$, $Al_xO_y$, $Ti_xO_y$ or the like, and a thickness (dimension in the direction perpendicular to the substrate 1) of the dielectric layer 5 may range from 100 nm to 1000 nm.

In some implementations, the method further includes: before forming the second electrode 9 on the side of the piezoelectric material layer 7 away from the first electrode 6, forming an electrode isolating layer 8 on the substrate 1 formed with the piezoelectric material layer 7, the electrode isolating layer 8 may be formed at side surfaces of the first electrode 6 perpendicular to the substrate 1 to at least isolate the first electrode 6 from outside.

For example, the electrode isolating layer 8 may also be formed at side surfaces of the first electrode 6 and the piezoelectric material layer 7 perpendicular to the substrate 1 to at least isolate the first electrode 6 and the piezoelectric material layer 7 from outside, so as to protect the first electrode 6 and the piezoelectric material layer 7.

For example, the electrode isolating layer 8 may include a portion perpendicular to the substrate 1, and a dimension (height) of a portion of the electrode isolating layer 8 perpendicular to the substrate 1 may be higher than a sum of thicknesses of the first electrode 6 and the piezoelectric material layer 7.

In some implementations, as shown in FIG. 2, the dimension of the second electrode 9 in a plane parallel to the substrate 1 may be substantially equal to a sum of the dimension of the first electrode 6 or the piezoelectric material layer 7 in a plane parallel to the substrate 1 and a dimension (thickness) of the portion of the electrode isolating layer 8 perpendicular to the substrate 1 in a direction parallel to the substrate 1 and perpendicular to a plane of the portion of the electrode isolating layer 8, and the orthographic projection of the second electrode 9 on the substrate 1 may completely overlap with the orthographic projections of the first electrode 6 and the piezoelectric material layer 7 on the substrate 1 and the orthographic projection of the portion of the electrode isolating layer 8 perpendicular to the substrate 1 on the substrate 1.

As shown in FIG. 2, the thickness of a portion of the second electrode 9 on the electrode isolating layer 8 may be less than that of another portion of the second electrode 9 on the piezoelectric material layer 7.

In some implementations, the electrode isolating layer 8 may be formed of $Si_xO_y$, $Si_xN_y$, $Si_xO_yN_z$, $Al_xO_y$, $Ti_xO_y$ or the like.

In some implementations, as shown in FIG. 2, the electrode isolating layer 8 may further include a portion formed in the same layer as the first electrode 6, that is, the portion parallel to the substrate 1.

For example, the dimension (thickness) of the portion of the electrode isolating layer 8 perpendicular to the substrate 1 in a direction parallel to the substrate 1 and perpendicular to a plane of the portion of the electrode isolating layer 8, and a dimension (thickness) of the portion of the electrode isolating layer 8 parallel to the substrate 1 in the direction perpendicular to the substrate 1, each may range from 100 nm to 1000 nm.

Certainly, as required, the dimension (thickness) of the portion of the electrode isolating layer 8 parallel to the substrate 1 in the direction perpendicular to the substrate 1 may also be greater than the dimension (thickness) of the portion of the electrode isolating layer 8 perpendicular to the substrate 1 in a direction parallel to the substrate 1 and perpendicular to a plane of the portion of the electrode isolating layer 8.

In some implementations, the method further includes: after forming the second electrode 9, forming a planarization layer 10 on the side of the substrate 1 formed with the second electrode 9.

The planarization layer 10 can protect structures below the planarization layer 10 and can flat the surface of the ultrasonic transducer. After the planarization layer 10 is formed, the ultrasonic transducer is completed. Since the ultrasonic transducer has a flat surface, structures such as TFT may be formed directly on the flat surface of the ultrasonic transducer, that is, the process for manufacturing the TFT may be directly joined with the method for manufacturing the ultrasonic transducer, which facilitates integration of functions. For example, after the planarization layer 10 is formed, a metal layer may be directly deposited on a side of the planarization layer 10 away from the substrate 1, and processes such as exposure, developing, etching and the like may be performed subsequently, so as to form a patterned gate layer of the TFT, and then an active layer, a source and a drain of the TFT may be formed successively. The planarization layer 10 may be formed of $Si_xO_y$, $Si_xN_y$, $Si_xO_yN_z$, $Al_xO_y$, $Ti_xO_y$, resin or the like.

An embodiment of the present disclosure further provides a method for manufacturing a display substrate, including: the method for manufacturing the ultrasonic transducer according to any of embodiments of the present disclosure; and after forming the second electrode 9 on the side of the piezoelectric material layer 7 away from the first electrode 6, forming a display element on the side of the substrate 1 formed with the second electrode 9.

The display element may include a thin film transistor for controlling displaying, or when the display substrate is an OLED display substrate, the display substrate may include an OLED light emitting device.

In the embodiment, the method for manufacturing the ultrasonic transducer may be directly joined with the process for manufacturing the display element, thus integration of functions is achieved. For example, the display substrate manufactured may be directly used as LTPS-AMOLED (Low Temperature Poly Silicon-Active Matrix Organic Light Emitting Diode) array substrate, for integrating functions such as fingerprint identification, touch operation in a display panel.

An embodiment of the present disclosure further provides an ultrasonic transducer, as shown in FIG. 2, including: a substrate 1 provided with a via hole 2 therein; a structural layer 4 provided on a side of the substrate 1 and provided with a cavity 3 therein, the cavity 3 is provided at a position of the structural layer 4 corresponding to that of the via hole 2.

In some implementations, the ultrasonic transducer further includes: a first electrode 6, a piezoelectric material layer 7 and a second electrode 9 provided successively on the structural layer 4 away from the substrate 1. For example, an area of the orthographic projection of the piezoelectric material layer 7 on the substrate 1 may range from $10 \times 10$ μm$^2$ to $500 \times 500$ μm$^2$.

In some implementations, the ultrasonic transducer further includes: a dielectric layer 5 provided between the structural layer 4 and the first electrode 6. The dielectric layer 5 may increase an adhesion force between the structural layer 4 and the first electrode 6. The dielectric layer 5 may cover an entire of the structural layer 4.

In some implementations, the ultrasonic transducer further includes: an electrode isolating layer 8 provided at side surfaces of the first electrode 6 perpendicular to the substrate 1 to at least isolate the first electrode 6 from outside.

For example, the electrode isolating layer 8 may be provided at side surfaces of the first electrode 6 and the piezoelectric material layer 7 perpendicular to the substrate 1 to isolate the first electrode 6 and the piezoelectric material layer 7 from outside, so as to protect the first electrode 6 and the piezoelectric material layer 7.

In some implementations, the ultrasonic transducer further includes a planarization layer 10 provided on a side of the substrate 1 provided with the second electrode 9. The planarization layer 10 can protect structures below the planarization layer 10 and can flat the surface of the ultrasonic transducer. Since the ultrasonic transducer has a flat surface, for example, structures such as TFT may be formed directly on the flat surface of the ultrasonic transducer, which facilitates integration of functions.

An embodiment of the present disclosure provides a display substrate including: a plurality of ultrasonic transducers according to any of embodiments of the present disclosure; and a display element provided on the second electrode 9 of each of the ultrasonic transducers away from the piezoelectric material layer 7, the ultrasonic transducers are arranged in an array.

For example, an orthographic projection of the piezoelectric material layer 7 of each of the ultrasonic transducers on the substrate 1 may range from $10 \times 10$ μm$^2$ to $500 \times 500$ μm$^2$, so as to adapt to the dimension of the display element.

In the embodiment, the electrode isolating layer 8 of each of the ultrasonic transducers may be provided at side surfaces of the first electrode 6 perpendicular to the substrate 1 for isolating first electrodes of the ultrasonic transducers.

Figure 3:
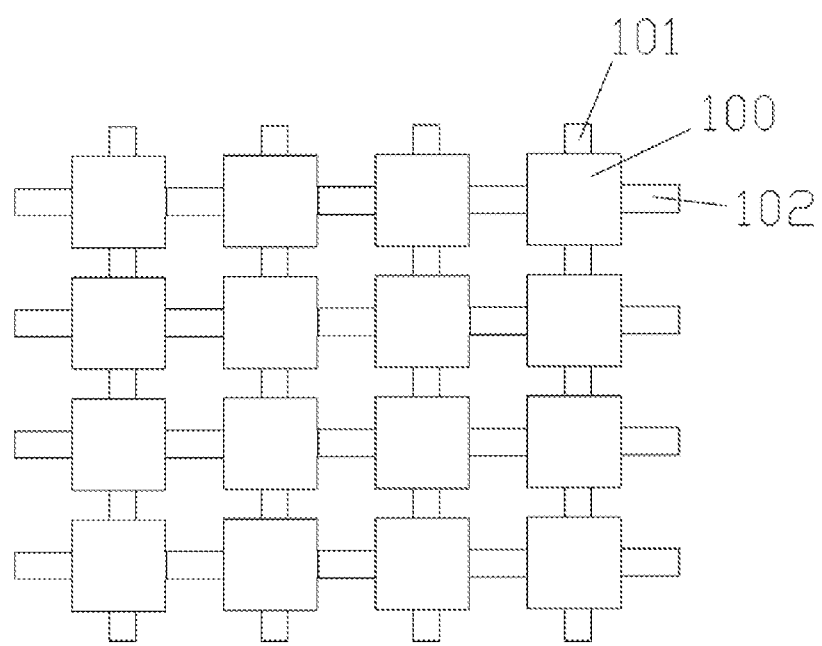
FIG. 3 shows a structural diagram of a display substrate in an embodiment of the present disclosure.

In some implementations, as shown in FIG. 3, the display substrate further includes: a plurality of first driving lines 101 parallel to and spaced apart from each other and a plurality of second driving lines 102 parallel to and spaced apart from each other, the first driving lines 101 and the second driving lines 102 are intersected with each other, each of the ultrasonic transducers 100 is provided at an intersection of one of the first driving lines 101 and one of the second driving lines 102, and each of the first driving lines 101 and each of the second driving lines 102 are respectively coupled to the first electrodes 6 and the second electrodes 9 of corresponding ones of the ultrasonic transducers.

The display substrate of the embodiment facilitates to integrate functions such as fingerprint identification, touch operation or the like.

It should be understood that, the above embodiments are merely exemplary embodiments for explaining principle of the present disclosure, but the present disclosure is not limited thereto. Various modifications and improvements may be made by those ordinary skilled in the art within the spirit and essence of the present disclosure, these modifications and improvements fall into the protection scope of the present disclosure.

The invention claimed is:

1. A method for manufacturing an ultrasonic transducer, comprising:
   forming a via hole in a substrate;
   forming a structural layer on a side of the substrate, the structural layer cover the via hole; and
   etching the structural layer from a side of the substrate away from the structural layer by using the substrate formed with the via hole as a blocking layer, to form a cavity at a position of the structural layer corresponding to that of the via hole, wherein
   the method further comprises:
   after forming the via hole in the substrate and before forming the structural layer on the side of the substrate, polishing and/or grinding both sides of the substrate formed with the via hole, so that a first side of the substrate on which the structural layer is to be formed and a second side of the substrate away from the first side are smooth.

2. The method of claim 1, wherein the via hole is formed in the substrate by using a laser beam to irradiate the substrate.

3. The method of claim 1, wherein the structural layer is formed of organic material or inorganic insulation material.

4. The method of claim 3, wherein the structural layer is etched from the side of the substrate away from the structural layer by using a dry etching process and using the substrate formed with the via hole as the blocking layer.

5. The method of claim 4, wherein the dry etching process is performed by using plasma formed from oxygen.

6. The method of claim 3, wherein the structural layer is etched from the side of the substrate away from the structural layer by using a wet etching process and using the substrate formed with the via hole as the blocking layer.

7. The method of claim 1, further comprising:
after forming the structural layer on the side of the substrate, forming a first electrode on a side of the structural layer away from the substrate; and
forming a piezoelectric material layer on a side of the first electrode away from the structural layer; and
forming a second electrode on a side of the piezoelectric material layer away from the first electrode.

8. The method of claim 7, further comprising:
before forming the first electrode on the side of the structural layer away from the substrate, forming a dielectric layer on the side of the structural layer away from the substrate.

9. The method of claim 7, further comprising:
before forming the second electrode on the side of the piezoelectric material layer away from the first electrode, forming an electrode isolating layer on the substrate formed with the piezoelectric material layer, the electrode isolating layer is formed at side surfaces of the first electrode perpendicular to the substrate to at least isolate the first electrode from outside.

10. The method of claim 7, further comprising:
after forming the second electrode on the side of the piezoelectric material layer away from the first electrode, forming a planarization layer on the side of the substrate formed with the second electrode.

11. A method for manufacturing a display substrate, comprising:
the method for manufacturing the ultrasonic transducer of claim 7; and
after forming the second electrode on the side of the piezoelectric material layer away from the first electrode, forming a display element on the side of the substrate formed with the second electrode.

* * * * *